United States Patent [19]

Edwards et al.

[11] Patent Number: 4,558,432
[45] Date of Patent: Dec. 10, 1985

[54] NON-VOLATILE SEMICONDUCTOR MEMORY CIRCUITS

[75] Inventors: Colin W. Edwards, Gerrards Cross; Kenelm G. D. Murray, Chiddingfold, both of England Kingdom

[73] Assignee: Hughes Microelectronics Limited, Glenrothes, Scotland

[21] Appl. No.: 411,131

[22] Filed: Aug. 24, 1982

[30] Foreign Application Priority Data

Aug. 25, 1981 [GB] United Kingdom .................. 8125919

[51] Int. Cl.$^4$ ........................................... G11C 11/40
[52] U.S. Cl. ..................................... 365/154; 365/185
[58] Field of Search .......................... 365/154, 190, 185

[56] References Cited

U.S. PATENT DOCUMENTS 4,207,615  6/1980  Mar .................................. 365/154 X
4,348,745  9/1982  Schmitz .............................. 365/154

Primary Examiner—Joseph A. Popek
Attorney, Agent, or Firm—J. Holtrichter, Jr.; W. J. Bethurum

[57] ABSTRACT

Memory circuits having a floating gate transistor as a non-volatile storage element are constructed with a shunt transistor across the floating-gate transistor which in the event of a short circuit between the floating gate and the transistor substrate causes the memory to go into a predetermined fail-safe condition. The circuits are cross-coupled flip-flops with a driver and a complementary driver or load connected in series in each of the circuits, one driver or complementary driver or load being a floating gate transistor such as a FATMOS. Short circuiting of the floating gate to the control gate of the floating-gate transistor gives the same fail-safe condition.

11 Claims, 3 Drawing Figures

NON-VOLATILE SEMICONDUCTOR MEMORY CIRCUITS

The present invention relates to non-volatile semiconductor memory circuits and in particular to those involving a floating gate field effect transistor.

Semiconductor memories can be classified as volatile (where stored information is lost on power removal) and non-volatile (where stored information is maintained on power removal, and can be accurately retrieved after subsequent power-up). One particular type of non-volatile semiconductor memory uses floating gate field effect transistors, such as the FATMOS transistors described in U.K. Patent Specification No. 2000407.

The FATMOS is basically a control gate plus floating gate MOS transistor with a portion of the floating gate close to the semiconductor substrate. When the source and drain connections are connected to an appropriate potential (one positive relative to the other) and a suitable potential of a first magnitude applied to the control gate, the transistor conducts. Upon removal of the control gate potential, conduction ceases. If a potential of a second and higher magnitude is applied to the control gate with the drain at zero voltage, the transistor again conducts, but in addition electric charges tunnel between the floating gate and the transistor substrate through the portion of the floating gate closest to the substrate. This charge remains on the floating gate even when the control gate potential is removed and increases the switching threshold of the device from its normal threshold. The charge on the floating gate enables the transistor to be employed in a non-volatile memory, as described in U.K. Patent Specification No. 2000407. The switching threshold of the FATMOS is returned to its normal level by applying between the control gate and drain a potential of approximately the second and higher potential but of opposite polarity.

In normal, non-volatile operation of a latch including such a FATMOS device, a voltage of typically +5 to +7 volts is applied to the control gate of the FATMOS. To write non-volatile information into the latch, a voltage of typically +8 to +15 volts is applied to the control gate of the FATMOS. If power is removed from the latch and then subsequently restored, it settles into a logic state dictated by its state during the earlier non-volatile write operation.

However, in order for the electric charges to tunnel between the floating gate and the transistor substrate it is necessary for the floating gate to be physically very close to the substrate over at least a part of the area of the floating gate. A thin layer of oxide acts as insulator between this portion of the floating gate and the substrate and with age or use can fail causing a short circuit between the floating gate and the transistor substrate. The control gate then no longer controls the operation of the transistor and any stored information is lost. In this failed condition the output from the latch may disrupt associated circuits and cause unpredictable errors.

The present invention is concerned with providing a semiconductor memory circuit in which shorting of the floating gate causes a failure to a predetermined state so that the effect on associated circuits is known and can be arranged to cause minimum disruption.

According to the present invention there is provided a non-volatile semi-conductor memory circuit having a pair of cross-coupled branches connectable across a common supply voltage, each branch including a driver and a complementary driver or load connected in series at an output node in which one of the complementary driver or loads, or drivers includes a floating gate field effect transistor whose threshold voltage may be varied so as to store data in the circuit, the current through the variable threshold transistor at a given potential on its control gate varying between upper and lower values in dependence on the threshold voltage, and the corresponding complementary driver or load, or driver, in the other branch includes a fixed threshold reference transistor, the current through the reference transistor being intermediate the upper and lower values at the same given potential on its gate, wherein the complementary driver or load, or driver, which includes the variable threshold transistor has connected in parallel with it a shunt transistor whose gate is connected to the control gate of the variable threshold transistor, the current through the shunt transistor being substantially less than that through the variable threshold transistor, at the same given potential on its gate.

Non-volatile semiconductor memory circuits constructed in accordance with the present invention will now be described by way of example and with reference to the accompanying drawings in which.

Figure 1:
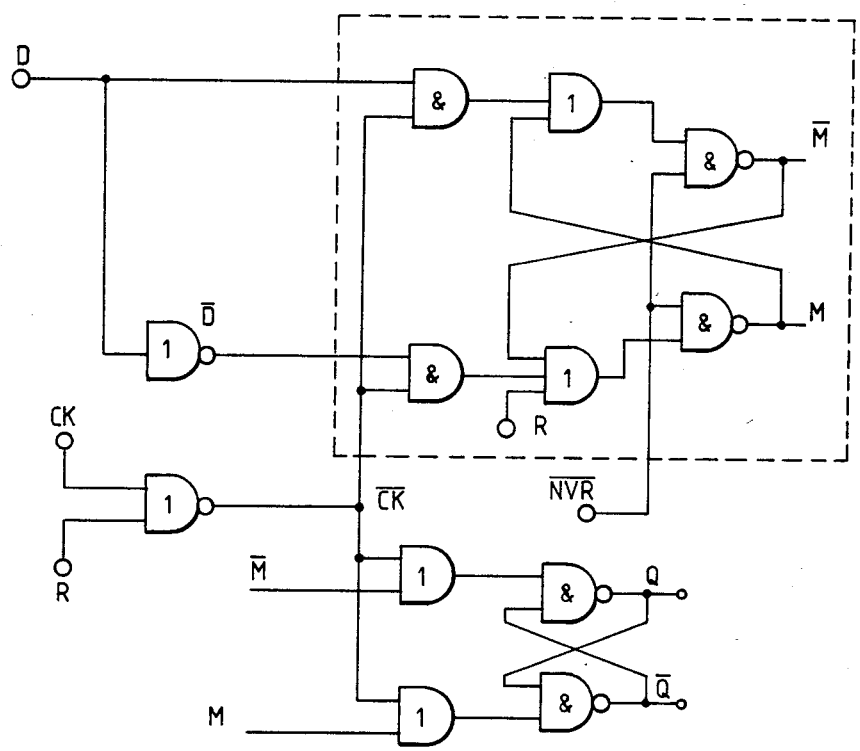
FIG. 1 is a logic diagram of a D-type flip-flop.

Referring to FIG. 1 there is shown a D-type master-slave flip-flop with a reset. The usual symbols are used for the AND, OR, NAND and NOR gates, the input signal input being D, the clock signal input CK and the reset signal input R. The master flip-flop is enclosed within the dashed box and has outputs M, $\overline{M}$ which are connected to the slave flip-flop below the dashed box giving output signals Q, $\overline{Q}$. Only the master flip-flop need be non-volatile and it has a non-volatile read signal input $\overline{NVR}$. In normal volatile operation a data signal is applied at the input D which passes to the master flip-flop when the clock signal on CK is low. This data is held in the master flip-flop as long as there is power on the device and its sets the outputs M $\overline{M}$ appropriately, which in turn determine the output Q $\overline{Q}$ when CK is high. The reset signal on R sets M low and $\overline{M}$ high irrespective of the signal on input D.

In non-volatile operation the data signal is written into the master flip-flop in the same way as above, except that a high voltage is applied to the floating gate transistors in the flip-flop to cause tunnelling of electrical charges. The written data appears at the outputs Q $\overline{Q}$ when CK is high as long as there is power on the cell. After a power-down the data is read out, once the power is restored, by putting a pulse signal on the $\overline{NVR}$ input which sets that input low and then lets it go high again, while CK is high. When the $\overline{NVR}$ is low both M and $\overline{M}$ are held high so that when $\overline{NVR}$ goes high again the master flip-flop is unstable and it moves towards a state determined by the thresholds of the transistors which have been altered by the tunnelling of the electrical charges. Thus it settles to the state determined by the written data and this is read out at the outputs Q $\overline{Q}$.

Figure 2:
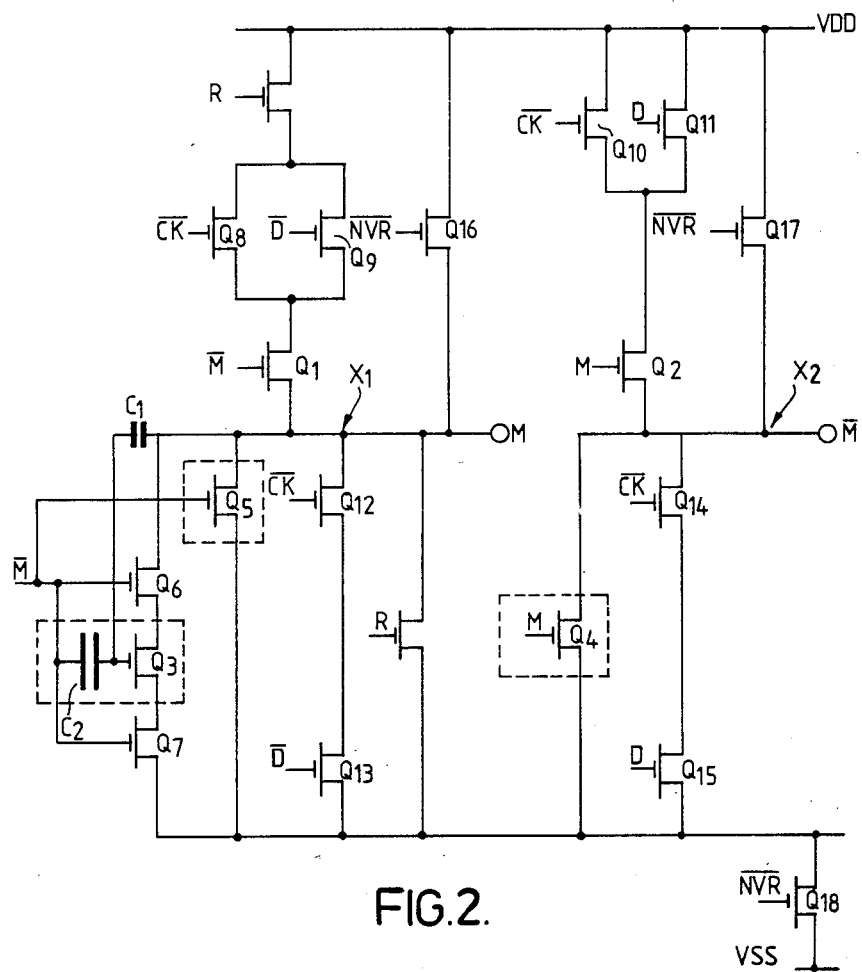
FIG. 2 is a circuit diagram of a first non-volatile latch for use in the flip-flop of FIG. 1.

FIG. 2 shows a CMOS master flip-flop for use in the circuit of FIG. 1. It includes P-channel complementary drivers (or loads) $Q_1$, $Q_2$ and N-channel drivers constituted by a FATMOS device $Q_3$ with its series transistors $Q_6$, $Q_7$ and a reference transistor $Q_4$. A small N-channel shunt transistor $Q_5$ is connected across the FATMOS $Q_3$ and its series transistors $Q_6$, $Q_7$, with its gate connected to the control gate of the FATMOS and the gates of the series transistors. The series transistors are formed on the same substrate as the FATMOS $Q_3$ and the floating gate of the FATMOS driver overlies the drain of the series transistor $Q_6$. It is through this portion of the floating gate that tunnelling of electric charges occurs during non-volatile writing of data into the latch. A capacitor $C_1$ represents the thin oxide layer between the floating gates and the drain of transistor $Q_6$. Similarly a capacitor $C_2$ represents the thicker oxide layer between the floating gate and the control gate.

The gates of the transistors $Q_1$ to $Q_7$ are cross-coupled to the nodes of each opposite branch of the cell such nodes being indicated as $X_1$ and $X_2$. The signal levels at these nodes set the output signals from the cell M and $\overline{M}$. Input data signals D, $\overline{D}$ and a clocking signal $\overline{CK}$ control input switching transistors $Q_8$ to $Q_{15}$ to enable data to be written into the cell. If the clocking signal $\overline{CK}$ is at its high level (CK low) the P-channel transistors $Q_8$ and $Q_{10}$ will be "off" and the N-channel transistors $Q_{12}$ and $Q_{14}$ will be "on", so that when the data signal D is high the P-channel transistor $Q_{11}$ is "off" and the N-channel transistors $Q_{15}$ is "on" which causes the node $X_2$ to drop to its logic "0" state and conversely the signal $\overline{D}$ causes the P-channel transistor $Q_9$ to turn "on" and the N-channel transistor $Q_{13}$ to turn "off", allowing the node $X_1$ to rise to its logic "1" state. In this way data is put into the cell from the input switching transistors when the clocking signal $\overline{CK}$ is high and can be held in a non-volatile written state by raising the electrode voltage on the FATMOS device $Q_3$ with $\overline{CK}$ at its low level, in the manner described in the above mentioned U.K. Patent Specification No. 2000407.

The voltage on the control gate of a transistor at which it starts to conduct is the threshold voltage of the transistor. The FATMOS device $Q_3$ has a normal threshold voltage when its floating gate is uncharged of VTN volts (typically approximately 1 volt). When the floating gate is charged during a non-volatile writing operation the threshold voltage rises to approximately VTN+2 volts. The reference transistor $Q_4$ is similar in size and shape to the combination of the FATMOS $Q_3$, the series transistors $Q_6$, $Q_7$ and the shunt transistor $Q_5$ but has a fixed threshold voltage set by implantation to approximately VTN+1 volt. Thus during the non-volatile writing operation the threshold of the FATMOS is set to be approximately 1 volt either above or below the threshold of the reference transistor depending on the state of the FATMOS i.e. depending on the data in the cell.

The difference in thresholds between $Q_3$ and $Q_4$ when the data has been written causes corresponding data to be read out at a later time when the $\overline{NVR}$ pulse is applied to transistors $Q_{16}$ to $Q_{18}$. When the $\overline{NVR}$ signal is low $Q_{16}$ and $Q_{17}$ are "on" and $Q_{18}$ is "off" causing both nodes to rise to the line voltage $V_{DD}$. Return of $\overline{NVR}$ to its high level then causes both nodes to fall since $Q_3$ to $Q_7$ are all "on". However, due to the difference in threshold voltage between $Q_3$ and $Q_4$ one node falls faster than the other of the regenerative effect of the cross-coupling between the branches. For example, if $Q_4$ has the higher threshold then it will start to turn "off" before $Q_3$ causing node $X_2$ to fall slower which due to the cross-coupling keeps $Q_3$ "on" and causes node $X_1$ to fall even faster until the flip-flop settles to the state with M low and $\overline{M}$ high.

During reading the clocking signal $\overline{CK}$ must be at its low level to present any interference from the data signal D. The series transistors $Q_6$, $Q_7$ have thresholds below that of $Q_4$, so that they do not adversely influence the operation of the cell during reading. Their primary purpose is to give a well defined value to the lower threshold of $Q_3$ and to improve the layout of the transistors on their substrate. The shunt transistor $Q_5$ has a threshold voltage of approximately VTN but its channel has a higher length to width ratio (longer channel) than either $Q_3$ and its series transistors $Q_6$, $Q_7$ or $Q_4$ so that it draws little current and does not effect the normal non-volatile operation of the cell.

In the event of a short circuit developing across the thin oxide layer $C_1$ between the floating gate of FATMOS $Q_3$ and the drain of series transistors $Q_6$, node $X_1$ will control $Q_3$ rather than node $X_2$. This prevents regeneration from occuring during the read operation. When nodes $X_1$ and $X_2$ start to fall after the $\overline{NVR}$ pulse the same signal M is applied to both $Q_3$ and $Q_4$, the effective threshold voltage of $Q_3$ being VTN since the signal is applied directly to the floating gate. $Q_4$ having a higher threshold starts to turn off first but the resultant slowing of the fall of node $X_2$ does not keep $Q_3$ on since it is now controlled by node $X_1$. Thus both $Q_3$ and $Q_4$ start to turn off with the nodes $X_1$, $X_2$ midway between $V_{DD}$ and $V_{SS}$. At this point the small current through $Q_5$ which is still controlled by $X_2$ has an effect and causes the node $X_1$ to fall. Regeneration occurs and the flip-flop settles into the state with M low, $\overline{M}$ high. This is the fail-safe state to which the flip-flop will always go when $C_1$ short circuits, whatever the data in the cell.

In the event of a short circuit developing across the oxide layer $C_2$ between the floating gate of FATMOS $Q_3$ and the control gate, which is the second most likely point of failure in the circuit, the threshold of $Q_3$ will become VTN irrespective of the charge on the floating gate. The flip-flop will otherwise behave as normal and when the nodes $X_1$ $X_2$ start to fall after the $\overline{NVR}$ pulse, node $X_1$ will fall fastest since $Q_4$ has the higher threshold and starts to turn off first. Thus the flip-flop will settle to the state with M low, $\overline{M}$ high which is the same fail-safe state as occurs when $C_1$ short circuits.

For the above described cell to operate correctly it is necessary that the shunt transistors $Q_5$ should have minimal effect on the normal cell operation. The current through $Q_5$ must be substantially less than that through $Q_3$ at the same gate voltage. This can be achieved by giving the shunt transistor a higher threshold rather than a longer channel, provided there is sufficient current through it when $C_1$ fails to tip the flip-flop into the predetermined state.

Similarly the reference transistor $Q_4$ may be constructed with the normal threshold VTN but a longer channel so that at the same gate voltage it has a lower current than $Q_3$ when the threshold of $Q_3$ is VTN and a higher current than $Q_3$ when the threshold of $Q_3$ is VTN +2 volts.

Figure 3:
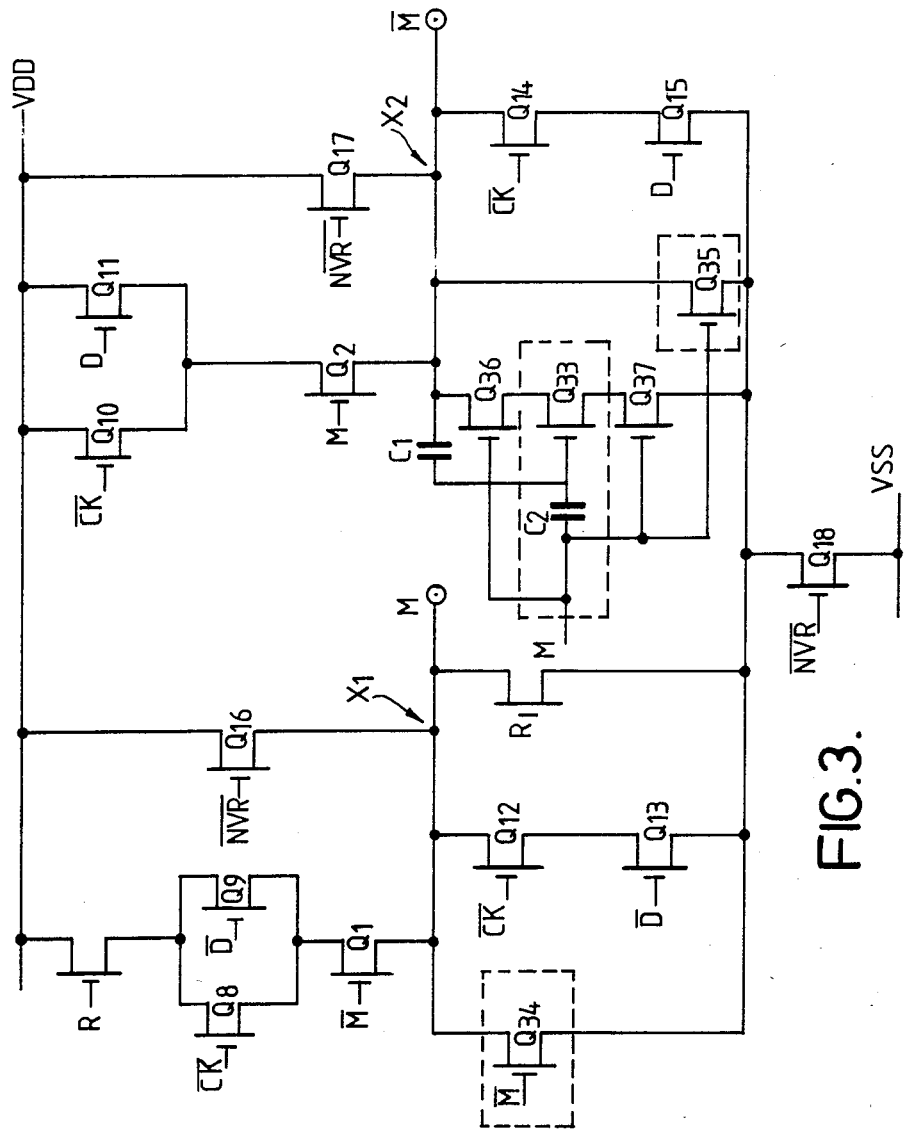
FIG. 3 is a circuit diagram of a second non-volatile latch for use in the flip-flop of FIG. 1.

FIG. 3 shows a CMOS flip-flop as in FIG. 2 with a fail-safe state of M low, $\overline{M}$ high when the oxide layer $C_1$ short circuits. However, in this case the FATMOS $Q_{33}$ with its series transistors $Q_{36}$, $Q_{37}$ and the shunt transistor $Q_{34}$ is at node $X_1$, i.e. the cell is reversed. All the other components are as in FIG. 2 and are numbered accordingly.

The FATMOS device $Q_{33}$ differs from $Q_3$ in FIG. 2 in that its normal threshold has not been set at VTN by implanting.

Using an unimplanted FATMOS simplifies the processing needed to produce the cell. However, the normal unimplanted threshold VTUN is typically approximately 3 volts which is considerably higher than the normal implanted threshold VTN which is typically approximately 1 volt. This prevents an unimplanted FATMOS from being used in the circuit of FIG. 2. In FIG. 3 the reference transistor $Q_{34}$ is similar in size and shape to the combination of $Q_{33}$, $Q_{36}$, $Q_{37}$ and $Q_{35}$ but is implanted to a threshold of approximately VTN+0.7 volts. The threshold of the FATMOS is arranged to be reduced by the tunnelling between its floating gate and the substrate to approximately VTUN−2 volts. Thus the threshold of $Q_{34}$ lies between the upper and lower thresholds of $Q_{33}$ which gives the same normal non-volatile reading and writing operations as in FIG. 2. The small shunt transistor $Q_{35}$ has a threshold approximately equal to that of $Q_{34}$ and its channel has a higher length to width ratio (longer channel) than either $Q_{33}$ and its series transistors $Q_{36}$, $Q_{37}$ or $Q_{34}$, so as to have minimal effect on the normal operation.

On failure of the oxide layer $C_1$, the FATMOS $Q_{33}$ is controlled by node $X_2$ while the series transistors $Q_{36}$ and $Q_{37}$ are still contolled by node $X_1$. After the $\overline{NVR}$ pulse nodes $X_1$ and $X_2$ will start to fall. The effective threshold of FATMOS $Q_{33}$ is now VTUN, since node $X_2$ is connected directly to the floating gate, and this is greater than the threshold VTN+0.7 of reference transistor $Q_{34}$. Thus $Q_{33}$ starts to turn off first and the node $X_1$ falls faster than the node $X_2$. This is the reverse of the operation of FIG. 2 where $Q_4$ starts to turn off first, and since the series transistors $Q_{36}$ $Q_{37}$ are controlled by node $X_1$ there is a regenerative action which tends to turn off these series transistors and with them the whole FATMOS group. Shunt transistor $Q_{35}$ then takes over from the FATMOS group $Q_{33}$, $Q_{36}$, $Q_{37}$ and the two transistors $Q_{34}$, $Q_{35}$ act as a flip-flop which because of the higher resistance of $Q_{35}$ tips towards the state in which M is low and $\overline{M}$ high.

Failure of the oxide layer $C_2$ causes the FATMOS device $Q_{33}$ to have a threshold of VTUN whatever the data stored and since this is greater than the threshold of $Q_{34}$, the cell will settle into the fail-safe condition of $\overline{M}$ high and M low when read. Thus the same fail-safe state is achieved as in FIG. 2 but with simpler processing of the FATMOS device.

Reading of data held in the master flip-flop of FIG. 2 or FIG. 3 is controlled by an $\overline{NVR}$ signal. This forces both nodes momentarily to the same high level and then let them compete for the "0" level, which improves the reliability of the data read from the cell and also allows data to be read out at any time independently of when the power supply is turned on. It is however possible to operate the cells without the $\overline{NVR}$ signal and its associated transistors ($Q_{16}$, $Q_{17}$, $Q_{18}$), by relying on the movement apart of the voltage rails $V_{DD}$ and $V_{SS}$ when the power supply is turned on. This is not as reliable or convenient as using the $\overline{NVR}$ signal but gives a simpler circuit and the failure to a predetermined fail-safe condition will still occur.

The above described procedure for ensuring the cell fails to a predetermined fail-safe condition is not restricted to D-type inputs but is of general application in the design of non-volatile memory elements, in particular RAM cells. The P-channel complementary drivers or loads and N-channel drivers can be replaced by N-channel and P-channel devices respectively, if required.

We claim:

1. A non-volatile semiconductor memory circuit comprising:
   a common supply voltage,
   a pair of cross-coupled branches connectable across said common supply voltage, each branch including a driver and a complementary driver connected in series at an output node in which one of the complementary drivers includes a floating gate field effect, variable threshold transistor having a control gate and whose threshold voltage may be varied so as to store data in the circuit, the current through said variable threshold transistor at a given potential on its control gate varying between upper and lower values in dependence on said threshold voltage,
   said complementary driver in the other branch including a fixed threshold reference transistor having a control gate, with the current through said reference transistor being intermediate the upper and lower values at said same given potential at its control gate, and
   a shunt transistor coupled in parallel with the complementary driver which includes said variable threshold transistor, said shunt transistor having a control gate coupled to the control gate of said variable threshold transistor, the current through said shunt transistor being substantially less than that through said variable threshold transistor at the same potential on the control gates of said shunt transistor and said variable threshold transistor.

2. A memory circuit according to claim 1, wherein the complementary driver which includes said variable threshold transistor has one or more fixed threshold transistors coupled in series with said variable threshold transistor, each fixed threshold transistor having a control gate, with said control gate of the variable threshold transistor being coupled to the control gates of said one or more fixed threshold transistors.

3. A memory circuit according to claim 2, wherein the complementary driver which includes said reference transistor has substantially similar physical dimensions to the combination of the complementary driver which includes said variable threshold transistor, said one or more fixed threshold transistors and said shunt transistor, said reference transistor being implanted to give a lower threshold voltage than the normal threshold voltage of said variable threshold transistor.

4. A memory circuit according to claim 3, wherein said shunt transistor has substantially the same threshold voltage as said reference transistor and said shunt transistor has a channel with a higher length to width ratio than the channels of either of the complementary drivers which include said reference transistor or said variable threshold transistor.

5. A memory circuit according to claim 2, wherein the complementary driver which includes said reference transistor has substantially similar physical dimensions to the combination of the complementary driver which includes said variable threshold transistor, said one or more fixed threshold transistors and said shunt transistor, said reference transistor and said variable threshold transistor being implanted to give a higher threshold voltage for said reference transistor than the normal implanted threshold voltage of said variable threshold transistor.

6. A memory circuit according to claim 5, wherein the threshold voltage of said shunt transistor is substantially equal to the normal threshold voltage of said variable threshold transistor, said shunt transistor having a channel with a higher length to width ratio than either of the complementary drivers which include said reference transistor or said variable threshold transistor.

7. A memory circuit according to claim 1, wherein the transistors are MOS transistors.

8. A memory circuit according to claim 1, wherein the variable threshold transistor is a FATMOS transistor.

9. A memory circuit according to claim 1, including means for precharging both output nodes to an identical logic state.

10. A non-volatile semiconductor latch circuit for providing predetermined output states in the event of an oxide layer failure comprising:

a common supply voltage, first and second cross-coupled branches connectable across said common supply voltage, said first and second branches each including a driver and a complementary driver coupled in series at respective first and second output nodes, the complementary driver of said first branch including a floating gate field effect, variable threshold transistor having a substrate separated from said floating gate by an oxide layer, said variable threshold transistor having an implanted normal threshold and having a control gate coupled to said second output node, the complementary driver of said first branch also including a fixed threshold transistor having a source to drain channel coupled in series with said variable threshold transistor between said variable threshold transistor and said first node, and having a control gate coupled to the control gate of said variable threshold transistor, said source to drain channel being positioned with a portion at said floating gate with said oxide layer positioned between for providing tunneling of electric charges so that the threshold voltage of said variable threshold transistor may be varied to store data in said latch, the current through said variable threshold transistor at a given potential on its control gate varying between upper and lower values in dependence on the threshold voltage, the complementary driver of said second branch including a fixed threshold reference transistor having a control gate coupled to said first output node, the current through said reference transistor being intermediate said upper and lower values with said same given potential on the control gate of said reference transistor, gating means coupled to said common supply voltage and to said first and second branches for applying said supply voltage to said first and second output nodes for non-volatile reading of the states stored in said variable threshold transistor and said reference transistor, and a shunt transistor coupled in parallel with the complementary driver of said first branch and having a control gate coupled to the control gate of said variable threshold transistor, the current through said shunt transistor being substantially less than the current through said variable threshold transistor with the same potential on their control gates, whereby in the event of a failure of said oxide layer between said floating gate and the source to drain channel of said fixed threshold transistor causing the voltage at said first node to be applied to said floating gate and the effective threshold voltage of said variable threshold transistor to be said normal implanted threshold voltage, the current flow through said variable threshold transistor, said reference transistor and said shunt transistor during non-volatile reading causes said variable threshold to become conductive and said reference transistor to become non-conductive providing said predetermined output states, and in the event of a failure of said oxide layer between said floating gate and said substrate causing the threshold voltage of said variable threshold transistor to be said normal implanted threshold voltage, the current flow through said variable threshold transistor and said reference transistor during non-volatile reading causes said transistors to become respectively conductive and non-conductive providing said predetermined output states.

11. A non-volatile semiconductor latch circuit for providing predetermined output states in the event of an oxide layer failure comprising:

a common supply voltage, first and second cross-coupled branches connectable across said common supply voltage, said first and second branches each including a driver and a complementary driver coupled in series at respective first and second output nodes, the complementary driver of said first branch including a floating gate field effect, variable threshold transistor having a substrate separated from said floating gate by an oxide layer, said variable threshold transistor having a control gate coupled to said first output node, the complementary driver of said first branch also including a fixed threshold transistor having a source to drain channel coupled in series with said variable threshold transistor between said variable threshold transistor and said first output node and having a control gate coupled to the control gate of said variable threshold transistor, said source to drain channel having a portion positioned at said floating gate with said oxide layer positioned between for providing tunneling or electric charges so that the threshold voltage of said variable threshold transistor may be varied to store data in said latch, the current through said variable threshold transistor at a given potential on its control gate varying between upper and lower values in dependence on the threshold voltage, the complementary driver of said second branch including a fixed threshold reference transistor having a control gate coupled to said first output node, the current through said reference transistor being intermediate said upper and lower values with said same given potential on the control gate of said reference transistor, gating means coupled to said common supply voltage and to said first and second branches for applying said supply voltages to said first and second output nodes for non-volatile reading of the states stored in said variable threshold transistor and said reference transistor, and a shunt transistor coupled in parallel with the complementary driver of said first branch and having a control gate coupled to the control gate of said variable threshold transistor, the current through said shunt transistor being substantially less than the current through said variable threshold transistor with the same potential on their control gates, whereby in the event of a failure of said oxide layer between said floating gate and the source to drain channel of said fixed threshold transistor causing the voltage at said first node to be applied to said floating gate and the threshold voltage of said variable threshold transistor being said normal unimplanted threshold voltage, the current flow through said variable threshold transistor, said reference transistor and said shunt transistor during non-volatile reading causes said variable threshold transistor to become non-conductive and said reference transistor to become conductive providing said predetermined output states, and in the event of a failure of said oxide layer between said floating gate and said substrate causing the threshold voltage of said variable threshold transistor to be said normal unimplanted threshold voltage, the current flow through said variable threshold transistor and said reference transistor during non-volatile reading causes said transistors to become respectively non-conductive and conductive providing said predetermined output states.

* * * * *